United States Patent [19]

Kitagawa

[11] 4,138,916

[45] Feb. 13, 1979

[54] KEY ASSIGNOR

[75] Inventor: Hiroshi Kitagawa, Hamamatsu, Japan

[73] Assignee: Kabushiki Kaisha Kawaigakki, Hamamatsu, Japan

[21] Appl. No.: 811,079

[22] Filed: Jun. 29, 1977

[30] Foreign Application Priority Data

Jul. 2, 1976 [JP] Japan .................................. 51-78646

[51] Int. Cl.² .............................................. G10H 1/00
[52] U.S. Cl. .................................... 84/1.01; 84/1.24; 84/DIG. 2; 84/DIG. 23; 340/365 R
[58] Field of Search ...................... 84/1.01, 1.03, 1.24, 84/DIG. 2, DIG. 7, DIG. 23; 340/365 R, 365 S

[56] References Cited

U.S. PATENT DOCUMENTS

| 3,981,217 | 9/1976 | Oya ..................................... 84/1.01 |
| 4,022,098 | 5/1977 | Deutsch .............................. 84/1.01 |
| 4,074,233 | 2/1978 | Swain .................................. 84/1.01 |

*Primary Examiner*—Robert K. Schaefer
*Assistant Examiner*—Leonard W. Pojunas, Jr.

[57] ABSTRACT

A key assignor comprising a scanning means, a first clock memory, a second memory for releasing a switch information, a comparator, a priority circuit device, a means for inhibiting the write-in operation, and a means for extracting key codes. Key switches are divided into blocks to scan the latter without scanning all of key switches. Scanning time can considerably be reduced as compared to prior arts, thereby enhancing response greatly.

2 Claims, 12 Drawing Figures

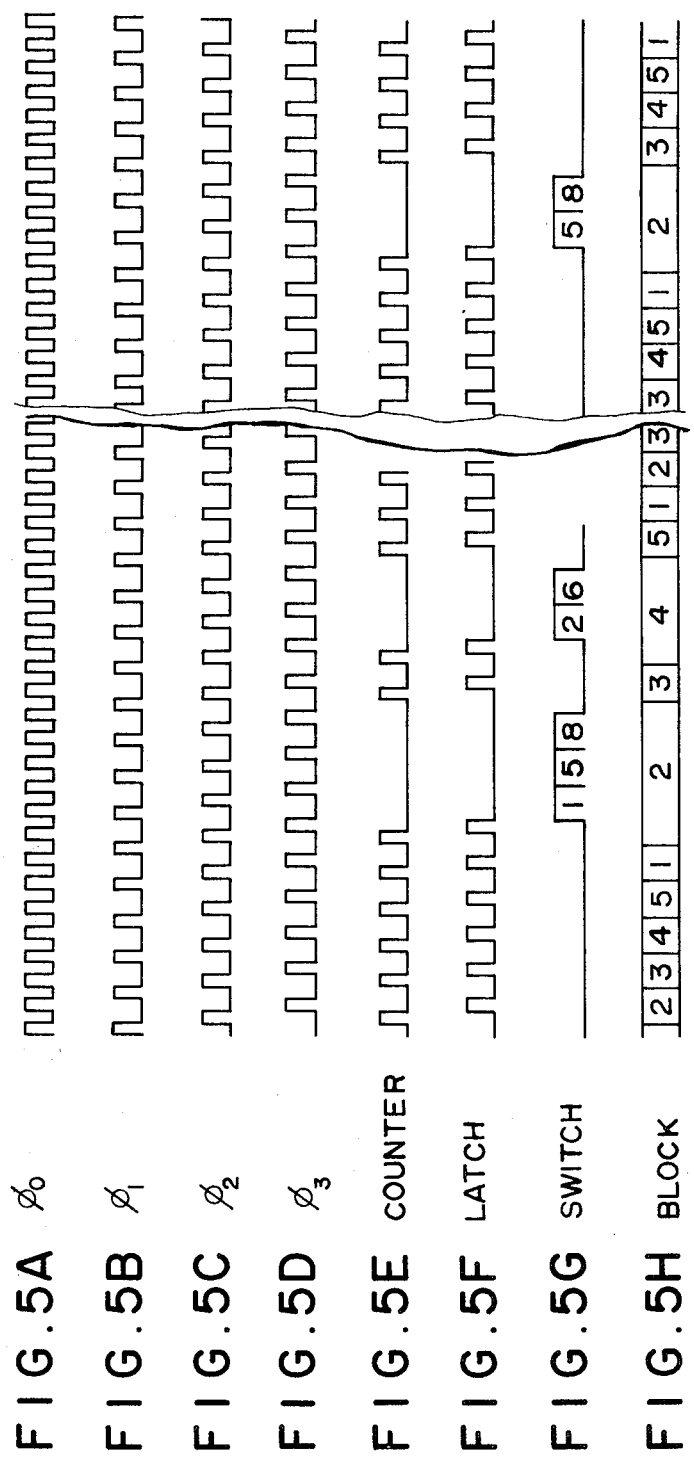

KEY ASSIGNOR

BACKGROUND OF THE INVENTION

1. Field of the Invention

The present invention relates to a key assignor for use in electronic musical instruments.

2. Description of the Prior Art

In electronic instruments such as an electronic organ having a number of key switches, and in case of transferring opening and closing informations of switches to a desired circuit, it is uneconomical to provide a direct connection between the switches and the circuit because a quantity of wiring becomes massive. Further, since the number of connection pins is limited in order to integrate the circuits, an increase in the number of pins impairs integration. Moreover, in terms of limitation relative to sound source of 10 fingers and two feet as seen in the electronic organ, the number of sounds to be produced is twelve, and therefore, twelve sound sources will suffice. It is apparent from the above that the opening and closing information of the switches may be put in twelve channels to decrease the number of circuits, which reduces cost and makes it possible to provide integration.

In the past, a system has been used, wherein key switches are successively scanned by a predetermined clock so that the on-off information is formed into TDM (Time Division Multiplication) signal or PCM (Pulse Code Modulation) signal in synchronism therewith, and the key code is multiplied and put in desired circuits. However, the aforesaid system requires one scanning section for scanning all of the switches in order to feed the opening and closing information of all of the switches. For example, where 154 key switches composed of 61 upper keys, 61 lower keys, and 32 pedal keys are scanned at a time slot of 10 $\mu$s (micro-second), it requires 1.54 ms (milli-second) for one scanning, and time displacement relative to those switches turned on after scanned has been encountered. Further, it is of no use to scan all of the switches to feed information other than is needed. Obviously, if a change in on or off is delivered by transferring the on state, the quantity of information will be decreased. It may readily be discriminated in normal contacts that distinction of on and off will be in the order such that the odd contact is in on state while the even contact is in on state, such as on followed by off and off followed by on.

SUMMARY OF THE INVENTION

It is therefore an object of the present invention to provide a key assignor, which can provide a time slot only relative to a changed key switch without scanning all key switches, and which can enhance the response of even the changed switch to the closing thereof so as to be adaptable for the high speed due to integration.

The above-mentioned object may be achieved by the present invention which provides a key assignor comprising scanning means for block-dividing a plurality of key switches by pass lines to successively scan said key switches every block by a predetermined clock, said key switches being arranged on one pass line of a switch matrix circuit with said key switches arranged at an intersection between two pass lines; a first memory for temporarily storing, by a predetermined clock, a switch information released from the other pass line by said block scanning; a second memory for storing the output of said first memory by blocks to release the switch information of the block corresponding to one prior to scanning of the block scanning; a comparator for comparing switch states at two times released from said first and second memories to detect change in on or off state; a priority selection device for successively selecting, by a predetermined clock, outputs of said comparator in order of higher priority first in accordance with the predetermined priority order; means for inhibiting said block scanning and the writing-in operation into said first and second memories during the operation of said priority selection device and means for releasing a binary code corresponding to said block and a binary code of the output of said priority selection device to thereby extract key code data by turning the switch on and off.

BRIEF DESCRIPTION OF THE DRAWINGS

In describing the present invention, reference will be made to the accompanying drawings in which:

FIGS. 5 A to H are a time chart for explaining the operation of the embodiment according to the present invention.

DESCRIPTION OF THE PREFERRED EMBODIMENT

Figure 1:
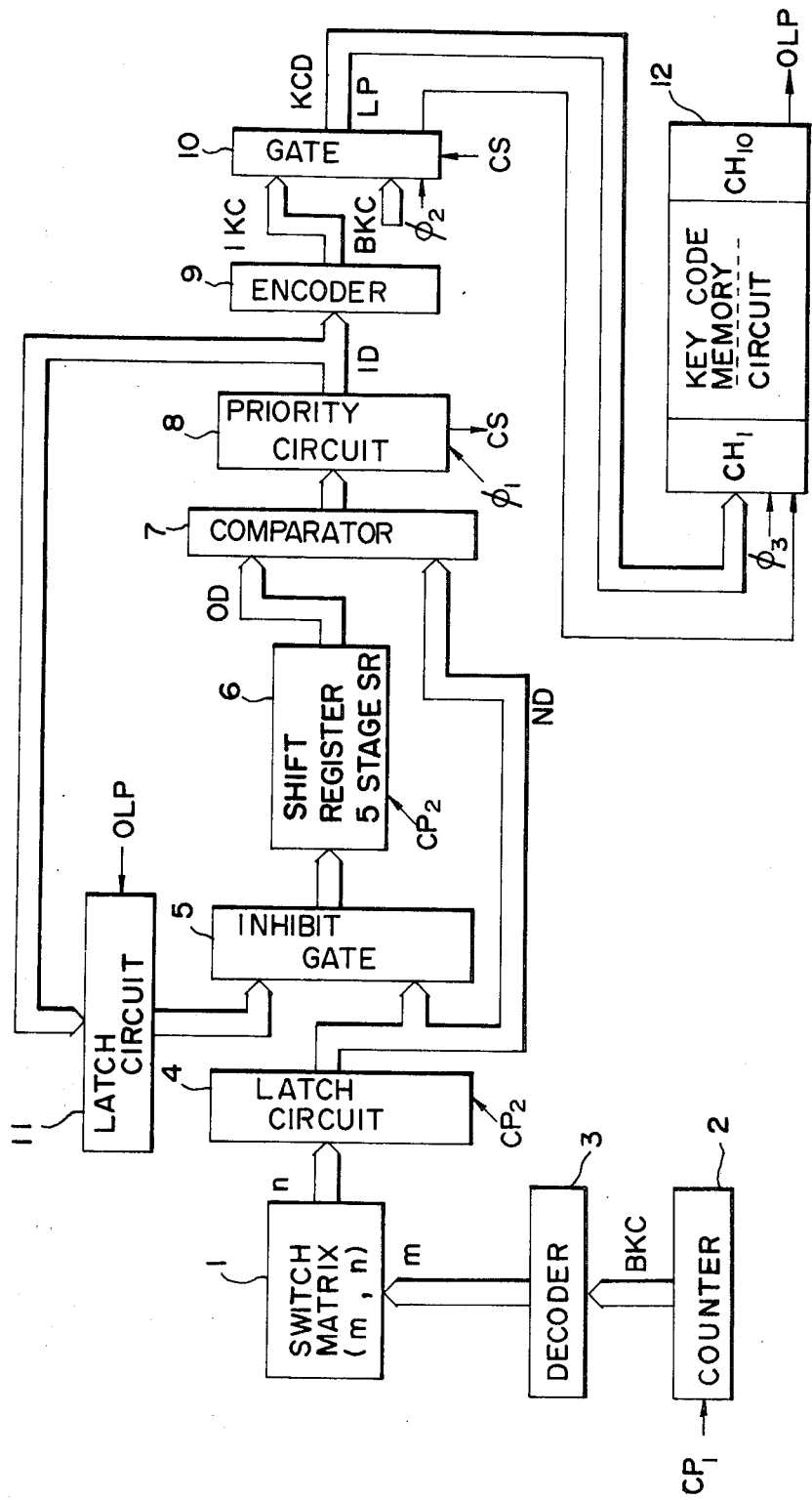
FIG. 1 is a block diagram showing the structure of an embodiment according to the present invention.

Referring now to FIG. 1, a switch matrix circuit 1, which has 60 switches, is arranged at an intersection of pass lines of n = 12 and m = 5 and being divided into five blocks by the m line. A counter 2 is counted by a clock $CP_1$ and releases a key code BKC of block. This counter 2 is in the form of a quinary counter, and the block key code BKC to be released enters into a decoder 3 to sequentially scan the pass lines of m = 5 in the switch matrix circuit. This causes the block key code to be released from the pass lines of n = 12. Switch information is parallelly imparted to a latch circuit 4 and is then temporarily stored by a clock $CP_2$. This output is entered into a 5-stage shift register 6 through a comparator 7 and an inhibit gate 5. Also, the 5-stage shift register 6 stores an output of the latch circuit 4 by means of the clock $CP_2$ and is then released. That is to say, the latch circuit 4 releases an information ND (new data) in a state of new key, whereas the shift register 6 releases an information OD (old data) not scanned. The comparator 7 compares switch informations between two times, that is, ND with OD, and releases "1" when the key switch state is changed or when turning on or off occurs. This output enters into a priority circuit 8 to select an information of highest priority among those released from the comparator 7, changed informations ID being sequentially released one by one by a clock $\phi_1$. This output enters into an encoder 9 and is converted into a binary code corresponding to the key and enters as the key code IKC in the block into a gate 10. The block code BKC released from the counter 2 also enters into the gate 10 and is gated by a signal CS, which in turn release "1" during the course of selection of priority, and releasing the key code data KCD, and the clock $\phi_2$ is also gated by the signal CS into a key code memory circuit 12 of 10 channels in the form of a latch pulse LP causing the key code to be stored. Whether the key code data KCD to be released is due to on or off may be discriminated by employment of a procedure for taking an on-key code data in case of odd time while taking an off-key code data in case of even time, on the base of the inevitability wherein the first time indicates on and the second time indicates off. In the case where more than 11 key switches are turned on despite the presence of 10 switches to be memorized successively, the key code data KCD will be overflown. For this reason, an overflowing latch pulse OLP is entered into a latch circuit 11 to temporarily store the then changed information ID of the key and entering into the inhibit gate 5, and the overflow key code data is released from the latch circuit 4 in order to generate it again when scanned. It is designed so that the switch information corresponding to the overflown switch is inhibited by the inhibit gate 5 so as not to be written into the shift register 6. In this manner, the key code data KCD resulting from the key-on is again released at the time of successive scanning until an empty channel is provided.

Figure 2:
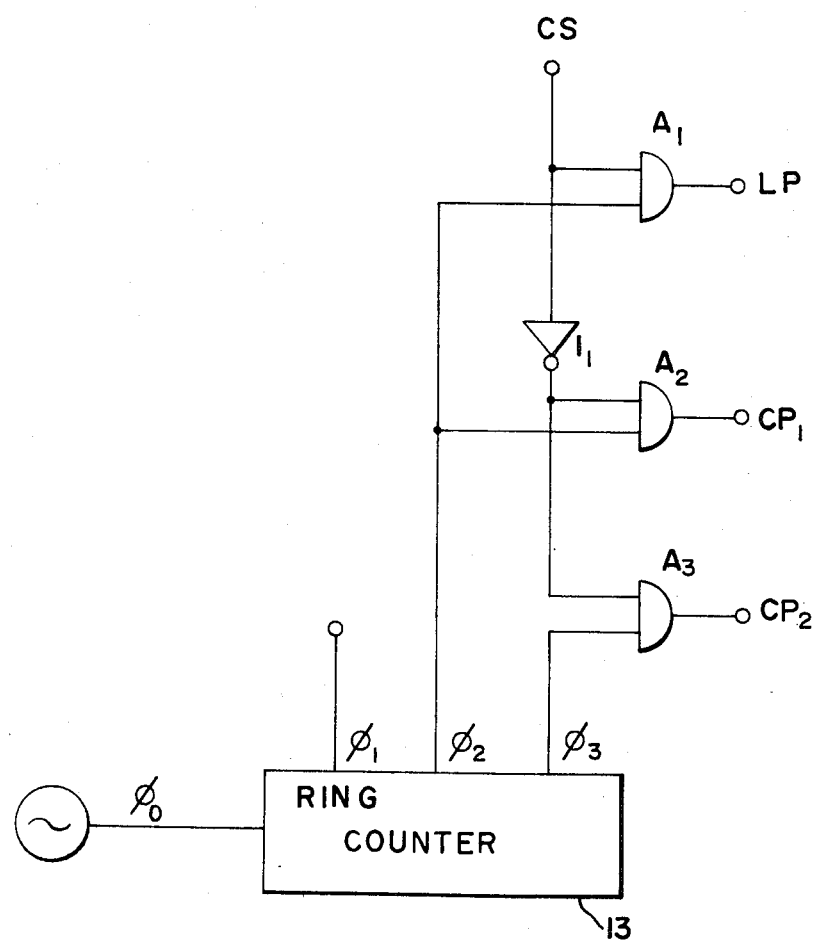
FIGS. 2 through 4 are detailed illustrations showing principal parts in the embodiment shown in FIG. 1.

FIG. 2 is a logic circuit for control clocks entering into various circuits. A ring counter 13, which is in the form of a ternary counter, performs counting by means of a clock $\phi$. The output clock $\phi_1$ enters into the priority circuit 8, and clocks $\phi_2$ and $\phi_3$ are gated by AND circuits $A_1$, $A_2$ and $A_3$, respectively by a signal CS which releases "1" during the operation of the priority circuit 8. Timing for these, that is, the relation between the latch pulse LP, clock $CP_1$ ($\phi_2$), and $CP_2$ ($\phi_3$) is as given in FIG. 5 later described.

Figure 3:
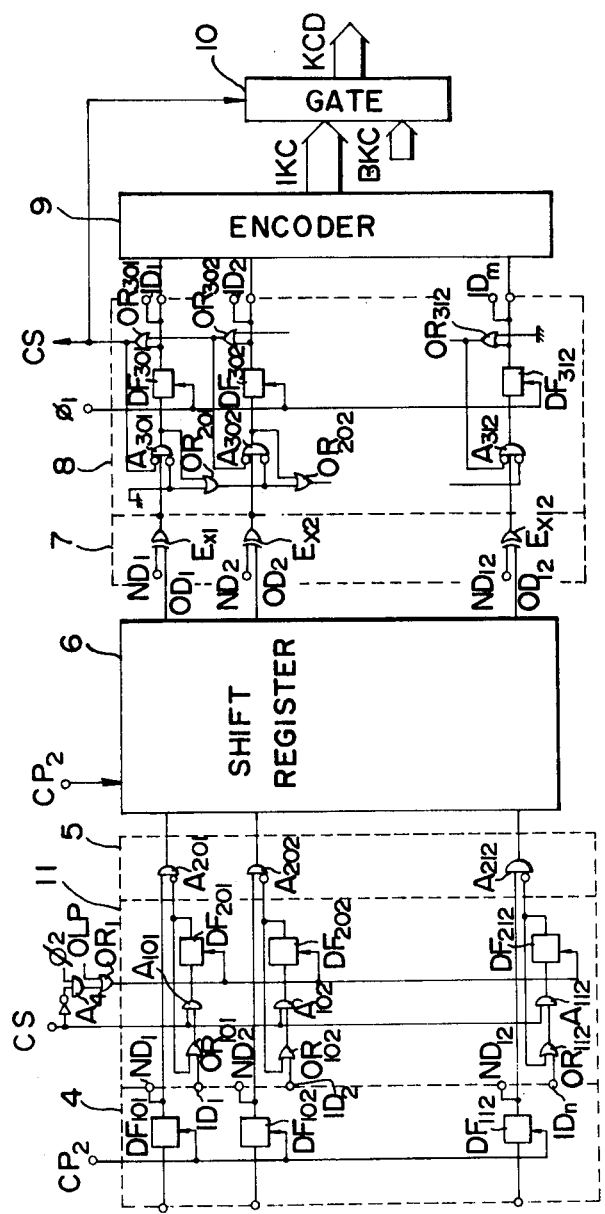

FIG. 3 is a detailed explanatory view in association with the latch circuit 4, inhibit gate 5, shift register 6, comparator 7, priority circuit 8, encoder 9, gate 10 and latch circuit 11 shown in FIG. 1. The pass lines of n = 12 in the switch matrix circuit are connected to D-type flip-flops $DF_{101}$–$DF_{112}$ within the latch circuit 4 as indicated by the broken lines, respectively, the information of block-designated key switch being latched by the clock $CP_2$. Assume that D-type flip-flops $DF_{201}$–$DF_{212}$ within the latch circuit 11 as indicated by the broken lines release "0", outputs $ND_1$–$ND_{12}$ of the $DF_{101}$–$DF_{112}$ enter the 5-stage shift register 6 through AND circuits $A_{201}$–$A_{212}$, respectively. The shift register 6 releases key signals $OD_1$–$OD_{12}$ in the same block before scanning 1 by the clock $CP_2$, and the outputs $ND_1$–$ND_{12}$ and the key signals $OD_1$–$OD_{12}$ are entered into exclusive OR circuits $EX_1$–$EX_{12}$ within the comparator 7 as indicated by the broken lines, respectively, and when a discordance occurs therebetween, "1" is released. Assume now that "1" is released in the exclusive OR circuits $EX_2$ and $EX_4$, the "1" is entered into AND circuits $A_{302}$ and $A_{304}$, respectively, within the priority circuit 8 as indicated by the broken lines. Assume again that "1" is not entered in the other AND circuits and OR circuits $OR_{301}$–$OR_{312}$ release "0", then the AND circuit $A_{302}$ releases "1". This output releases "1" through the OR circuits $OR_{202}$–$OR_{212}$ and inhibits input of AND circuits $A_{303}$–$A_{312}$, and only the output of the exclusive OR circuit $EX_2$ is selected and entered into D-type flip-flop $DF_{302}$. This signal is latched by the clock $\phi_1$ and releases the changed signal $ID_2$. Next, the signal $ID_2$ is entered into AND circuit $A_{302}$ through the OR circuit $OR_{302}$ to inhibit output of the exclusive OR circuit $EX_2$, and the output of the circuit $EX_4$ is released from the AND circuit $A_{304}$. As a result, the D-type flip-flop $DF_{304}$ releases "1" by means of the next clock $\phi_1$ and releasing the signal $ID_4$. In this manner, outputs of the exclusive OR circuits $EX_1$–$EX_{12}$ are sequentially selected by the clock $\phi_1$ in order of one higher in priority first in accordance with the predetermined order of priority to release the signal ID. The signal ID is entered into the encoder 9 and formed into a binary code to release the key code IKC within the block. Further, the block code BKC of the output of the counter 2 entered into the gate 10 and the key code IKC within the block are gated by the signal CS released from the OR circuit 301 to release the key code data KCD. Further, the signal CS enters into the logic circuit shown in FIG. 2 to cause the scanning of the switch matrix circuit 1 and the operation of the latch circuit 4 and the shift register 6 to be waited until the changed signal in the block has been released. Thereafter, when the overflow signal OLP is produced, the changed signal ID at that time is temporarily stored in the flip-flops $DF_{201}$ to $DF_{212}$ to inhibit signals corresponding to the signals $ND_1$–$ND_{12}$ in the AND circuits $A_{201}$–$A_{212}$. For example, supposing that when the changed signal $ID_3$ is released, the overflow signal OLP becomes "1", the changed signal $ID_3$ enters into the AND circuit $A_{103}$ through the OR circuit $OR_{103}$. Now the signal CS is "1", and the AND circuit $A_{103}$ releases "1", which is entered into the D-type flip-flop $DF_{203}$. Then, the overflow signal OLP is entered into the D-type flip-flops $DF_{201}$–$DF_{212}$ through the OR circuit $OR_1$ and the flip-flop $DF_{203}$ will latch "1". This output is entered into the AND circuit $A_{203}$ to inhibit the signal $ND_3$. Output of the D-type flip-flop $DF_{203}$ is entered into the OR circuit $OR_{102}$ and the flip-flop $DF_{203}$ releases "1" until reset. When the signal CS becomes "0", the D-type flip-flop $DF_{202}$ is reset by the clock $\phi_2$ released from the AND circuit $A_4$. Thus, a new key data ND is not written in the the register 6 during the presence of the overflow signal OLP.

Figure 4:
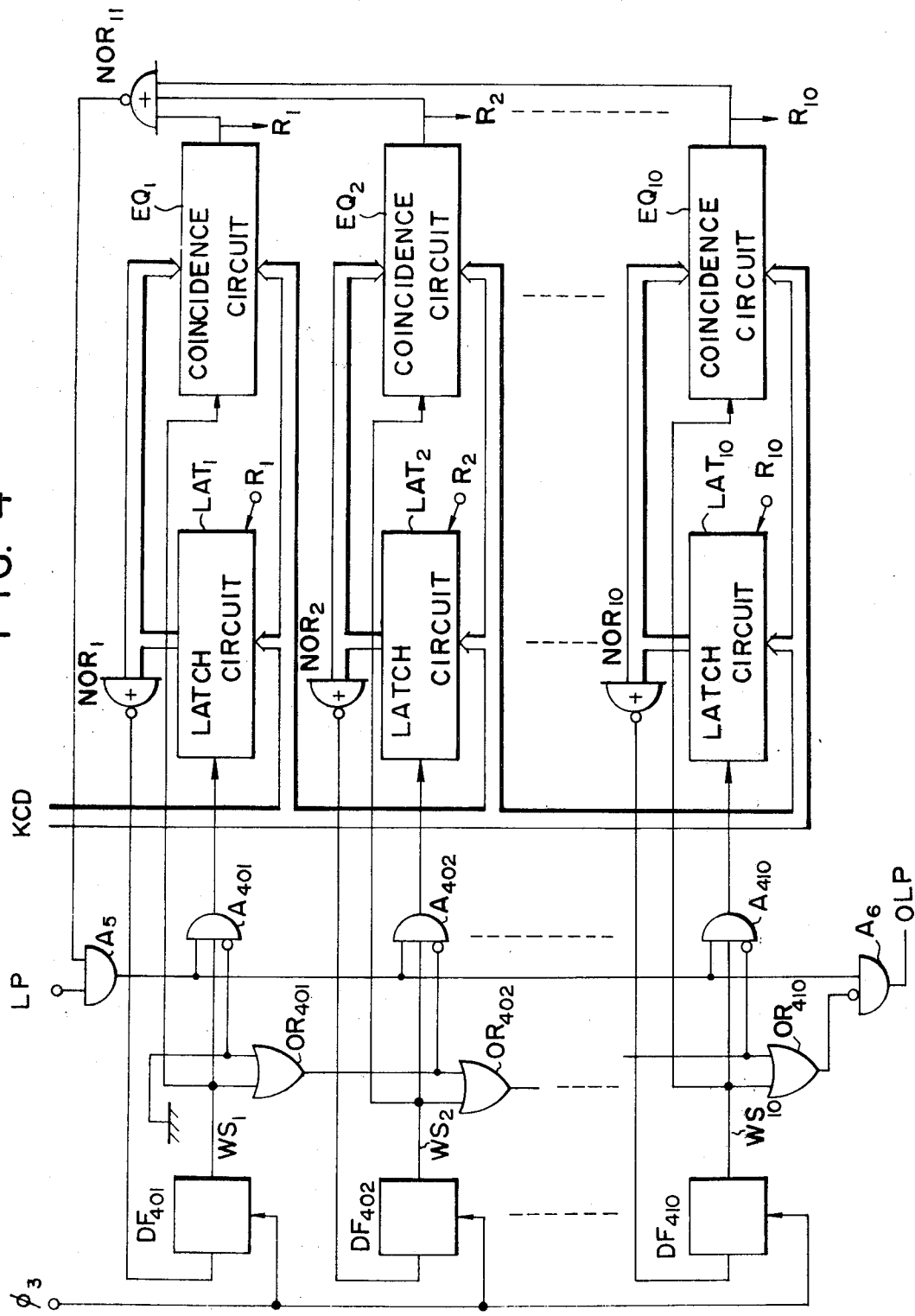

FIG. 4 is a detailed explanatory view of the key code memory circuit 12 shown in FIG. 1. The key code data KCD released from the gate 10 is released onto the pass line and is entered in parallel into latch circuits $LAT_1$–$LAT_{10}$ and coincidence circuits $EQ_1$–$EQ_{10}$ in the key code memory circuit 12 of 10 channels. A latch pulse LP released simultaneously therewith is entered into AND circuits $A_{401}$–$A_{410}$ through an AND circuit $A_5$. Assume now that all of the channels are empty, D-type flip-flops $DF_{401}$–$DF_{410}$ all release "1", which is entered into the AND circuits $A_{401}$–$A_{410}$. On the other hand, output of the D-type flip-flop $DF_{401}$ enters into the OR circuit $OR_{401}$ to render all of successive OR circuits $OR_{402}$–$OR_{410}$ in "1". As a consequence, all of gates of the AND circuits $A_{402}$–$A_{410}$ are inhibited, and the latch pulse LP entered through the AND circuit $A_5$ is released from the AND circuit $A_{401}$, so that the incoming key code data KCD is latched in the channel 1. In this manner, these empty channels are successively latched in order of one higher in priority first. Next, the thus latched key code data KCD causes "0" to be entered from NOR circuits $NOR_1$–$NOR_{10}$ to the D-type flip-flop $DF_{401}$–$DF_{410}$ to inhibit the AND circuits $A_{401}$–$A_{410}$ and to inhibit the latch pulse LP. The thus lached key code data KCD is further entered into the coincidence circuits $EQ_1$–$EQ_{10}$ in parallel with the latch circuits $LAT_1$–$LAT_{10}$, and such data is compared with another incoming key code data KCD. If they are identical, a coincidence output is applied to the NOR circuit $NOR_{11}$. When the coincidence is released, the NOR circuit $NOR_{11}$ releases 0 to inhibit the latch pulse LP at the AND circuit $A_5$, thus inhibiting that the same key code is latched in the other empty channels. The latch circuit is reset by the aforesaid coincidence output, which channel forms an empty channel. Assume that all of the channels store some key code and a different code data KCD is released, that is, when the key switch of more than ten channels is turned on, the key code data KCD starting the eleventh key thereof becomes an overflow signal, thus necessitating to release said key code until an empty channel is provided, and the control operation as previously mentioned is accomplished. As a result, when all of 10 channels are latched, the OR circuit $OR_{410}$ releases "0". This inverted output is entered into the AND circuit $A_5$ to form the latch pulse LP as the overflow signal, and the overflow latch pulse OLP signal is applied from the AND circuit $A_6$ to the latch circuit 11 through the OR circuit $OR_1$ to release the key code data KCD again.

FIGS. 5 A to H are a time chart for explaining the operation of the embodiment according to the present invention shown in FIG. 4. In FIG. 5A, the character $\phi_0$ is a master clock, and in FIGS. 5 B, C, and D, clocks $\phi_1$, $\phi_2$, and $\phi_3$ are 3-phase clocks, respectively, as discussed in FIG. 2, showing timing required for synchronization between the blocks or data delay. As one example of switch opening and closing, there is shown timing when the first, fifth and eighth keys in the second block, among five blocks, and the second and sixth keys in the fourth block are depressed and thereafter when the fifth and eighth keys in the second block are released. FIG. 5E shows the block whose key is varied according to the block code BKC by means of the counter 2, in the form of the clock $CP_1$, and FIG. 5F shows the signal ND representative of the latch output of the latch circuit 4 corresponding to the block code BKC, that is, the opening and closing state of key. FIG. 5G shows the key information in said blocks and FIG. 5H shows the block corresponding thereto, the opening and closing state of the illustrated key being indicated. In order to detect variation in the opening and closing state of keys, the comparator 7 is provided to compare the OD signal of information prior to scanning obtained after the latch output of the latch circuit in FIG. 5F has temporarily been stored by block into the shift register 6 as mentioned above, with the ND signal of a new latch output. Whether the key is in open or closed position may be discriminated, as previously mentioned, in such a manner that the blocks are scanned by the quinary counter and the on-off is scanned alternately dividing it such as the odd time and the even time. The resultant output is introduced into the priority circuit 8 and the changed information ID are orderly entered one by one into the encoder 9 in order of priority of the switch in FIG. 5G to form it into a binary code, thus generating the key code IKC in the block, which is entered into the gate 10 along with the block code BKC released from the counter 2, said codes being gated by the signal CS which releases "1" during the selection of priority to thereby extract the key code data KCD.

From the foregoing, it will be appreciated in the present invention that instead of scanning all of key switches, the key switches are divided into blocks which are scanned, and thereafter a new state for each block is compared with a state prior to scanning, whereby time slot is provided relative to only the key switch changed, and in addition, scanning time for the blocks is not locked but may be reduced and varied according to the number of switches in the blocks changed, and scanning speed in case of no-change is determined by the predetermined number of blocks. For example, in case of 154 key switches composed of 61 upper keys, 61 lower keys and 32 pedal keys, as previously mentioned, and assume that the number of blocks is 13, one block has 12 switches and scanning of one block is 10 $\mu s$ (micro-second), it merely requires, for one scanning, 0.13 ms (milli-second) at minimum and 0.25 ms at maximum even if 12 key switches should be changed simultaneously, which is possible to reduce scanning time approximately 6 to 10 times of that of prior art. This enables to greatly enhance response and to meet high speediness resulting from integration. Furthermore, lower clock frequency is also advantageously employed and decrease in quantity of wiring resulting from block scanning is extremely advantageous in case of utilizing integration. What is claimed is:

1. A key assignor comprising:
   a scanning circuit for block-dividing a plurality of key switches to successively scan the switches by blocks in accordance with a predetermined clock;
   change detecting means for detecting a change of the switch state in every block, said change detecting means comprising a first memory for temporarily storing switch information of a scanned block, a second memory for storing the switch information by block of a previous scan as was stored in said first memory; and comparator means for comprraring the switch states from said first and second memories to detect changes in the switch states;
   a priority circuit means for successively selecting, by a predetermined clock, outputs from the change detecting means in order of higher priority first, in accordance with a predetermined order to priority, the priority circuit means comprising, a first priority circuit for selecting one signal of a higher priority from a plurality of input signals, a memory circuit for temporarily storing the output from the first priority circuit and a gate circuit for inhibiting the input signals of lower priority than the selected output signal from the memory circuit;
   means for inhibiting the scanning circuit during the operation of the priority circuit means;
   means for converting into a binary code the block scanning output and the output from the priority circuit means to form key codes;
   a key code memory having a plurality of channels in parallel for temporarily storing the key codes;
   channel assigning means for detecting an empty channel of the key code memory to thereby assign the key codes to the empty channel in accordance with a predetermined order of priority, the channel assigning means comprising, means for detecting the empty channel, a second priority circuit for selecting the channels in order of higher priority first in a predetermined order of priority, and means for supplying a write clock to a designated one of the channels to enter therein the output from the second priority circuit; and
   means for detecting the coincidence between the entered key code and the next key code to inhibit the write clock and resetting said key code memory.

2. A key assignor according to claim 1, further comprising means for releasing overflow signals in a state of absence of an empty channel among said plural channels when it is being turned on to store the key code; a fourth memory in said priority circuit for temporarily storing said switch information by said overflow signal; and means for inhibiting the output of said first memory by the output of said fourth memory to again release the same switch information at the time of the next scanning.

* * * * *